US011171250B2

(12) United States Patent
Dupeyrat et al.

(10) Patent No.: US 11,171,250 B2
(45) Date of Patent: Nov. 9, 2021

(54) OPTICALLY TRANSPARENT ELECTROMAGNETICALLY SHIELDING ELEMENT COMPRISING A PLURALITY OF ZONES

(71) Applicants: SAFRAN ELECTRONICS & DEFENSE, Boulogne Billancourt (FR); CENTRE NATIONAL DE LA RECHERCHE SCIENTIFIQUE-CNRS-, Paris (FR); UNIVERSITE DE RENNES 1, Rennes (FR)

(72) Inventors: Cyril Dupeyrat, Boulogne Billancourt (FR); Patrice Foutrel, Boulogne Billancourt (FR); Philippe Besnier, Boulogne Billancourt (FR); Xavier Castel, Boulogne Billancourt (FR); Yonathan Corredores, Boulogne Billancourt (FR)

(73) Assignees: Safran Electronics & Defense, Boulogne Billancourt (FR); Centre National de la Recherche Scientifique-CNRS, Paris (FR); Universite de Rennes 1, Rennes (FR)

( * ) Notice: Subject to any disclaimer, the term of this patent is extended or adjusted under 35 U.S.C. 154(b) by 292 days.

(21) Appl. No.: 16/305,579

(22) PCT Filed: May 22, 2017

(86) PCT No.: PCT/FR2017/051264
§ 371 (c)(1),
(2) Date: Nov. 29, 2018

(87) PCT Pub. No.: WO2017/207893
PCT Pub. Date: Dec. 7, 2017

(65) Prior Publication Data
US 2020/0335641 A1   Oct. 22, 2020

(30) Foreign Application Priority Data

May 31, 2016   (FR) .................................... 16 54872

(51) Int. Cl.
*H01L 31/00* (2006.01)
*H01L 31/0216* (2014.01)
(Continued)

(52) U.S. Cl.
CPC .... *H01L 31/02164* (2013.01); *H01L 31/0203* (2013.01); *H01L 31/18* (2013.01)

(58) Field of Classification Search
CPC  H01L 31/02164; H01L 31/0203; H01L 31/18
See application file for complete search history.

(56) References Cited

U.S. PATENT DOCUMENTS

| 4,281,284 | A  | * | 7/1981 | Stutz ........................ H05K 9/00 |
| | | | | 324/627 |
| 2014/0169021 | A1 | | 6/2014 | Gilliland |
| 2016/0126361 | A1 | * | 5/2016 | Zhao ................... H01L 31/0488 |
| | | | | 136/251 |

FOREIGN PATENT DOCUMENTS

EP            1 835 522 A2    9/2007
WO    WO 2006/122608 A1    11/2006

OTHER PUBLICATIONS

PCT International Search Report for PCT/FR2017/051264, dated Sep. 12, 2017, 4 pages.
(Continued)

*Primary Examiner* — Mounir S Amer
*Assistant Examiner* — Alexander Belousov
(74) *Attorney, Agent, or Firm* — Patterson Thuente Pedersen, P.A.

(57) ABSTRACT

A shielding element comprises a rigid substrate and at least one electrically conductive two-dimensional structure which is placed on one of the faces of the substrate. The substrate
(Continued)

and the electrically conductive two-dimensional structure are such that the shielding element has optical-transmission and shielding-efficiency values at least one of which varies between two zones of the shielding element. Such a shielding element enables easier assembly of a detection system comprising multiple optical sensors.

9 Claims, 2 Drawing Sheets

(51) Int. Cl.
      *H01L 31/0203*    (2014.01)
      *H01L 31/18*      (2006.01)

(56) References Cited

OTHER PUBLICATIONS

English translation of PCT International Search Report for PCT/FR2017/051264, dated Sep. 12, 2017, 3 pages.
PCT Written Opinion of the ISA for PCT/FR2017/051264, dated Sep. 12, 2017, 5 pages.
Yan-Jun Sun, Hao Chang, Song-Hang Wu, Yan-Bing Leng, Li Wang: "Study on Electromagnetic Shielding of Infrared /Visible Optical Window", Modern Applied Science, vol. 9, No. 13, Dec. 2015 (Dec. 2015), pp. 231-236, XP002767456, Canadian Center of Science and Education. ISSN: 1913-1844, DOI: 10.5539/mas. v9n13p231.

* cited by examiner

OPTICALLY TRANSPARENT ELECTROMAGNETICALLY SHIELDING ELEMENT COMPRISING A PLURALITY OF ZONES

RELATED APPLICATIONS

The present application is a National Phase entry of PCT Application No. PCT/FR2017/051264, filed May 22, 2017, which claims priority from FR Patent Application No. 16 54872, filed May 31, 2016, said applications being hereby incorporated by reference herein in their entirety.

FIELD OF THE INVENTION

The present invention relates to an electromagnetically shielding element which is optically transparent, as well as a method for manufacturing such a shielding element.

BACKGROUND OF THE INVENTION

Numerous applications use optical sensors such as sensors sensitive to optical radiation within the infrared, although the operation of such sensors may be disrupted by electromagnetic radiation, particularly within the ultra high frequency. It is therefore known to arrange a shielding element in front of the optical input of such a sensor, the shielding element being at least partially opaque to a portion of ultra high frequency radiation while being at least partially transparent to optical radiation. To achieve this, the shielding element includes at least one two-dimensional structure which is electrically conductive while being at least partially transparent to optical radiation.

In addition, to be effective, the conductive two-dimensional structure must be electrically connected to the electrical ground of a support or vehicle on which the optical sensor is installed. Thus, the mounting of each optical sensor on its support or vehicle for use requires steps of assembling and attaching the shielding element in front of the optical input of the sensor, and steps of establishing an electrical connection that connects the conductive two-dimensional structure of the shielding element to ground.

More specifically, such a shielding element as known prior to the present invention comprises:
  a rigid substrate having two opposite faces and which is at least partially transparent, between its two faces, to at least one electromagnetic radiation having a frequency f between 0.1 GHz (gigahertz) and 40 GHz; and
  at least one electrically conductive two-dimensional structure which is arranged on one of the faces of the substrate, and which is at least partially transparent to optical radiation having a wavelength between 0.2 µm (micron) and 15 µm.

The substrate is also at least partially transparent between its two faces to this optical radiation. The optical transmissions concerned, for the substrate and the conductive two-dimensional structure, relate to the optical radiation which is intended to pass through the shielding element between the two faces.

In addition, the shielding efficiency, denoted EB(f) and expressed in decibels (dB), is defined by $EB(f) = -10 \cdot \log_{10}(T(f))$, where T(f) is an energy transmission coefficient of the shielding element for electromagnetic radiation having the frequency f between 0.1 GHz and 40 GHz, and which passes through the shielding element between its two faces.

In addition, complex optical detection systems are now being implemented which combine multiple optical sensors. These sensors can then be juxtaposed, for example on a mounting head with variable orientation. The assembly and attachment of all the electromagnetically shielding elements required for such a multiplicity of optical sensors—one shielding element per sensor—in order to produce the complete optical detection system then become complex and time-consuming. In addition, a separate electrical connection must be made for each shielding element, which further increases the complexity of manufacturing the multi-sensor system.

SUMMARY OF THE INVENTION

Considering this situation, one object of the invention is to reduce the complexity and the manufacturing cost of such a multi-sensor system.

To achieve this or other objects, a first aspect of the invention provides an optically transparent electromagnetically shielding element of the known type mentioned above, but which has multiple zones.

According to a first feature of the invention, the electrically conductive two-dimensional structure is arranged on one of the faces of the substrate at least within multiple separate zones of the shielding element. In addition, it is at least partially transparent in each zone to optical radiation having a wavelength between 0.2 µm and 15 µm.

According to a second feature of the invention, the substrate is at least partially transparent between its two faces to each optical radiation, and is of continuous material between all zones of the shielding element.

According to a third feature of the invention, the electrically conductive two-dimensional structure has at least one continuous electrical conduction path that connects portions of the two-dimensional structure each contained in one of the zones of the shielding element, for all zones.

According to a fourth feature of the invention, the shielding element has, in a first of the zones, a first set of values formed by at least one optical transmission value and a shielding efficiency value, which is different from a second set of values for said optical transmission and said shielding efficiency, effective in a second of the zones. For this fourth feature, the optical transmission values relate to a same wavelength of optical radiation, and the shielding efficiency values relate to a same frequency of electromagnetic radiation, for the first and second zones.

Thus, the invention provides a single shielding element which is suitable for a plurality of optical sensors which are juxtaposed. The assembly and attachment of this single shielding element when building a multi-sensor system is simpler than for multiple shielding elements which are separate, reducing the complexity and assembly cost of the multi-sensor system.

In addition, the shielding element of the invention integrates the electrical connection which interconnects all the parts of the conductive two-dimensional structure which are contained in all the zones. A single electrical connection towards the exterior of the shielding element, to ground, is then sufficient for the entire shielding element assembly, in other words for simultaneously protecting by shielding all the optical sensors of the multi-sensor system.

In first embodiments of the invention, the substrate may bear a first electrically conductive two-dimensional structure on a first of its faces in at least two separate zones of the shielding element, and the other face of the substrate may simultaneously bear a second electrically conductive two-dimensional structure in at least one of the two zones, referred to as a zone with double two-dimensional structures. Then, optionally, the substrate may be at least partially transparent to at least two electromagnetic radiations having different respective frequencies between 0.1 GHz and 40 GHz. In this case, the thickness of the substrate in the zone with double two-dimensional structures may be such that the value of the electromagnetic shielding efficiency relating to the one of the two electromagnetic radiations having the highest frequency is greater, by at least 5 dB and preferably at least 10 dB, than the value of the electromagnetic shielding efficiency relating to the other of the two electromagnetic radiations having the lowest frequency, when the two electromagnetic radiations pass through the shielding element between the two faces in the zone with double two-dimensional structures.

Possibly, in some of the first embodiments of the invention, said other face of the substrate may bear the second electrically conductive two-dimensional structure also in the two separate zones of the shielding element, and the shielding element may then have values for a substrate thickness measured between the two faces which are different between the two separate zones of the shielding element.

Generally for the invention, said at least one electrically conductive two-dimensional structure may comprise a layer of a metal, preferably silver, or of a transparent conductive oxide, preferably tin-doped indium oxide, this layer able to have a thickness that varies between two different zones of the shielding element.

Alternatively, said at least one electrically conductive two-dimensional structure may comprise an electrically conductive grid which is formed on the face of the substrate. In this case, the grid can have at least one value for a parameter selected among a grid pitch, a grid wire width, and a thickness of the conductive material forming the grid, which is different between two of the zones of the shielding element. The grid pitch and wire width are measured parallel to the face of the substrate, and the metal thickness is measured perpendicularly to the face of the substrate.

When the shielding element is also of the type of one of the first embodiments, in other words with two conductive two-dimensional structures, the first and second electrically conductive two-dimensional structures may each comprise a conductive grid in at least a same one of the two zones of the shielding element, referred to as a double-grid zone. The two faces of the substrate can then be parallel in the double-grid zone, and one of the two grids is preferably in alignment with at least a portion of the other grid in the double-grid zone, in a direction which is perpendicular to the two faces. In this manner, the total optical shadowing which is caused by the two grids in the double-grid zone is reduced, and is approximately equivalent to the shadowing that would be caused by only one of the grids.

A second aspect of the invention provides a detection system which comprises at least two optical sensors and a shielding element according to the first aspect of the invention. The sensors are fixed relative to the shielding element, such that a first of the zones of the shielding element remains located between an optical radiation input into a first of the sensors and an optical input field of this first sensor, and a second of the zones of the shielding element remains located between an optical radiation input into a second of the sensors and an optical input field of the second sensor.

Finally, a third aspect of the invention provides a method for manufacturing a shielding element according to the first aspect of the invention. Such a method comprises the following steps:
    providing the substrate, in the form of a rigid part which is of continuous material between all zones; and
    on at least one of the faces of the substrate, depositing at least one electrically conductive material so as to form at least a portion of said at least one electrically conductive two-dimensional structure, in at least some zones of the shielding element, at the same time as at least a portion of the continuous electrical conduction path.

When the substrate has a thickness which varies between two zones of the shielding element, and comprises the first and second conductive two-dimensional structures each in these two zones, the method may further comprise the following steps:
    machining or polishing the substrate in at least one of the two zones; and
    depositing at least one electrically conductive material on said other face of the substrate so as to form at least a portion of said second electrically conductive two-dimensional structure in at least one of the two zones of the shielding element.

In this case, during the deposition of electrically conductive material on said other face of the substrate, at least a portion of said second electrically conductive two-dimensional structure may be formed in at least one of the two zones of the shielding element at the same time as at least a portion of another continuous electrical conduction path which interconnects, on said other face of the substrate, portions of said second electrically conductive two-dimensional structure that are each contained in one of the two zones of the shielding element.

When one of the electrically conductive two-dimensional structures is a grid, a conductive material forming at least a portion of this grid can be deposited on the substrate and then selectively etched using a process of positive resist photolithography. Alternatively, a pattern complementary to the grid can be produced on the substrate by means of a negative resist, then a conductive material of the grid can be deposited on the substrate in portions which are devoid of resist, and the resist of the complementary pattern is then removed.

Finally, when the thickness of the conductive material of the grid is different between two of the zones of the substrate, the deposition of the electrically conductive two-dimensional structure may comprise at least the following substeps:
    producing an initial portion of the electrically conductive two-dimensional structure simultaneously in the two zones, this initial portion having a grid pattern and itself being electrically conductive; then
    at least in the one of the zones where the thickness of the conductive material of the grid is intended to be the greatest, electrodepositing additional conductive material on the initial portion of the electrically conductive two-dimensional structure.

This method is quite fast and economical for obtaining thicknesses of deposited conductive material that are significant and variable between different zones.

BRIEF DESCRIPTION OF THE DRAWINGS

Other features and advantages of the invention will become apparent from the following description of some non-limiting exemplary embodiments, with reference to the accompanying drawings, wherein.

For clarity, the dimensions that appear in these figures do not correspond to the actual dimensions nor to the actual dimensional ratios. In addition, identical references indicated in different figures denote identical elements or elements having identical functions.

DETAILED DESCRIPTION OF THE DRAWINGS

Figure 1:
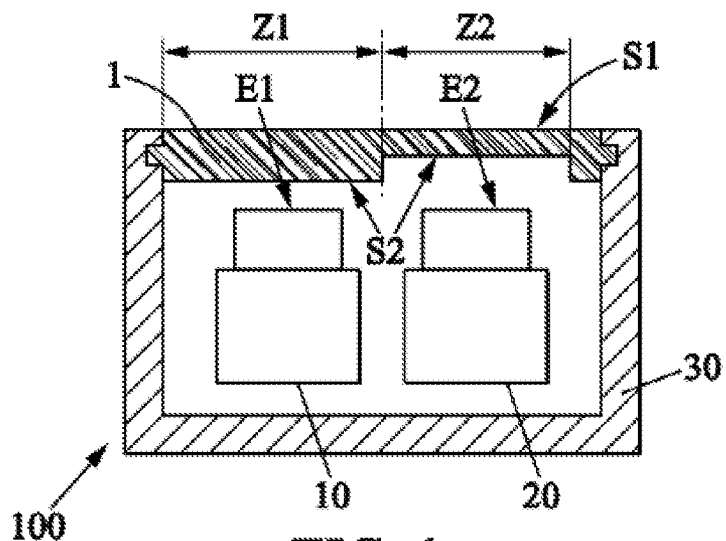
FIG. 1 illustrates an optical detection system according to the invention.

As shown to FIG. 1, a detection system 100 comprises two optical sensors 10 and 20 which are side by side in a housing 30. The two sensors 10, 20 are each intended to receive, during use, effective optical radiation of wavelengths between 0.2 µm (microns) and 15 µm, by optical input E1 for sensor 10, and by optical input E2 for sensor 20. The effective optical radiation of the two sensors 10 and 20 does not necessarily have identical wavelengths within the 0.2 µm-15 µm range.

However, interference at the sensors 10 and 20 may occur due to external electromagnetic radiation of frequencies between 0.1 GHz (gigahertz) and 40 GHz, particularly unwanted interference radiation. It is then necessary to protect the sensors 10 and 20 against such electromagnetic radiation, by elements which are at least partially opaque to electromagnetic radiation. Such protective elements against electromagnetic interference are called shielding elements in the terminology of the skilled person. The housing 30 may include such a shielding function, but in particular a window 1 providing a shielding function, referred to as an optically transparent shielding element in the general section of the present description, is arranged in front of the optical inputs E1 and E2 of the two sensors 10 and 20. According to the invention, the window 1 is formed by a single solid component, and is designed to simultaneously satisfy the optical and shielding requirements relating to the two sensors 10 and 20. To do so, the window 1 has a first set of optical and shielding characteristics in a first zone Z1 of the window which is intended to be located in front of optical input E1 within the system 100, and a second set of optical and shielding characteristics in a second zone Z2 which is intended to be located in front of optical input E2. Zones Z1 and Z2 of the window 1 may be adjacent but separated by an intermediate strip, in particular according to the spacing between the optical inputs E1 and E2. The optical and shielding characteristics of the window 1 in each of the zones Z1 and Z2 are adapted to the sensor 10 or 20 to which the zone is dedicated. In particular, the two sensors 10 and 20 may have different ranges of optical sensitivity within the wavelength range 0.2 µm-15 µm. They may also have shielding requirements that differ with respect to certain electromagnetic radiations within the frequency range 0.1 GHz-40 GHz.

Electromagnetic shielding is obtained by adding a two-dimensional structure which is electrically conductive on at least one of the faces S1 and S2 of the window 1. The shielding efficiency increases as the electrical conductance of the two-dimensional structure increases. But the optical transparency of the window 1 can be reduced by the two-dimensional structure, when the electrical conductance of the structure is significant and is homogeneous (no grid). However, the sensitivity of each optical path is dependent on the transparency level of the window 1 within the zone Z1 or Z2 located in front of the optical input of the sensor of this path.

The present invention allows combining, in the same part of the window 1, two different compromises between optical transparency and shielding efficiency, which are separately dedicated to each of the sensors 10 and 20.

Thus, and in general according to the invention, the window 1 comprises a substrate 2 and at least one two-dimensional structure which is electrically conductive and denoted 11 (FIGS. 2a to 2e and 3). The substrate 2 is at least partially optically transparent, in each of the zones Z1 and Z2, to the effective optical radiation of the sensor 10 or 20 which corresponds to this zone. Preferably, the substrate 2 is a part having a homogeneous composition, so that it is transparent in the two zones Z1 and Z2 simultaneously to the effective optical radiation of the two sensors 10 and 20. The substrate 2 may be based on silicon (Si), germanium (Ge), zinc sulfide (ZnS), silica ($SiO_2$), aluminum oxide ($Al_2O_3$), or magnesium oxide (MgO), for example.

The electromagnetic shielding function is produced by the two-dimensional structure 11, possibly combined with a second electrically conductive two-dimensional structure which is also incorporated into the window 1 and is denoted 12 (FIGS. 2c to 2e and 3).

Figure 2A:
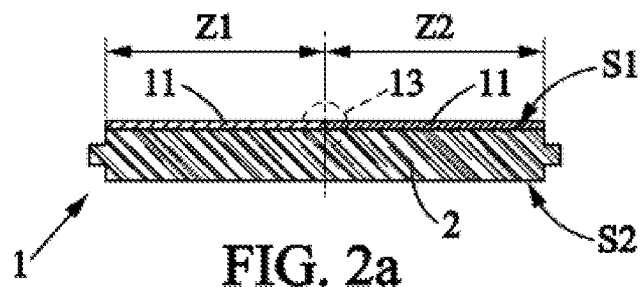
FIGS. 2a to 2e are sectional views of several shielding elements according to the invention.

In the embodiment of FIG. 2a, the window 1 comprises only one two-dimensional structure, denoted 11, which is arranged on face S1 of the substrate 2. Alternatively, the two-dimensional structure 11 may be arranged on face S2 of the substrate 2. The two-dimensional structure 11 has different compositions in the two zones Z1 and Z2, in order to simultaneously produce the compromises of optical transparency and shielding efficiency which are appropriate, one for sensor 10 and the other for sensor 20.

In a first type of possible composition for the two-dimensional structure 11 in at least one of the zones Z1 and Z2, it may comprise a stack of thin layers with at least one of these layers being electrically conductive in order to produce the shielding function. This electrically conductive layer may be of silver (Ag), or of tin-doped indium oxide (ITO "indium tin oxide"), for example. The shielding efficiency is higher when the thickness of the conductive layer perpendicularly to the face of the substrate 2 is higher. But then the optical transparency of this conductive layer decreases, due to reflection and/or absorption. The skilled person then knows combinations of dielectric layers with one or more conductive layers, appropriately selecting the thickness of each layer and the refractive index of each dielectric material used, in order to produce an optical transparency and shielding efficiency which are simultaneously sufficient for the respective sensor. Thus, the two-dimensional structure 11 may be a stack of metal and dielectric layers, in which the series of layers, the number of layers, the thicknesses of the layers, and/or the materials of the layers, may differ between the two zones Z1 and Z2 (FIG. 2a). Such thin layers can be deposited by one of the techniques known to those skilled in the art, such as sputtering, vacuum evaporation, laser ablation, or plasma-enhanced chemical vapor deposition, commonly designated as PE-CVD.

Figure 2B:
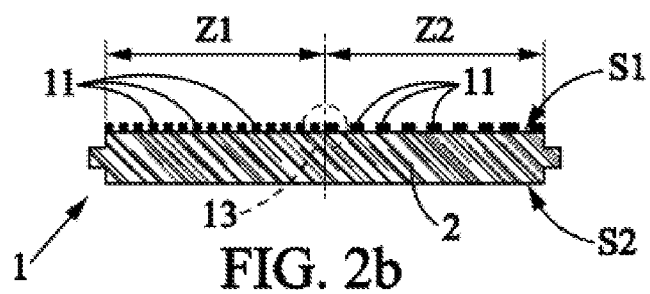

According to a second possible type of composition for the two-dimensional structure 11 in at least one of the zones Z1 and Z2, the two-dimensional structure 11 may be composed of a grid of conductive wires in each of the zones Z1 and Z2, as shown in FIG. 2b. Such a grid may have a square grid pattern, for example, and consist of conductive wires, for example of metal: copper or silver, which are arranged on face S1 of the substrate 2. The parameters affecting the bulk electrical conductance of the two-dimensional structure 11 are the grid pitch, the width of the grid wires, and the thickness of the conductive material that forms the grid wires, the grid pitch and wire width being measured parallel to face S1 of the substrate 2, and the thickness of the conductive material being measured perpendicularly to this face. The grids which are formed in one and the other of the zones Z1 and Z2 of the window 1 have at least one of these three parameters varying between the two zones in order to produce the compromise between optical transparency and shielding efficiency which is suitable for each of the sensors 10, 20, separately in the zone Z1 or Z2 which is dedicated to that sensor. For such a grid-based composition, the optical transmission of the two-dimensional structure 11 in each zone Z1, Z2 depends on the shadowing produced by the grid wires in this zone. According to one possible method for forming a conductive grid on the substrate 2, a conductive grid pattern may be first formed on face S1 by using a positive or negative lithographic resist. If a positive lithographic resist is used, a continuous layer of conductive material, in particular of silver or copper, is first deposited on face S1, possibly after a bonding layer. A layer of positive lithography resist is then deposited on the conductive layer, and irradiated through a mask in a pattern identical to that of the grid wires. The resist is then developed in the irradiated areas, then the conductive layer is etched, preferably chemically, in the locations no longer protected by any resist. If a negative lithographic resist is used, a continuous layer of lithographic resist is first deposited on face S1, and irradiated through a mask in a pattern identical to that of the grid wires. The resist is then developed in the non-irradiated areas and thus selectively removed at the locations of the wires to be formed. The conductive material is then deposited on both the resist and on the locations of face S1 which are devoid of resist, then any resist is finally removed by dissolution in a suitable solvent, so that conductive material remains only at the desired locations for wires on face S1. This second method is known by the term "lift-off" in the terminology of the skilled person. Once the conductive grid pattern, called the initial portion of the two-dimensional structure in the general section of the present description, has been deposited according to one of these two methods using positive or negative lithographic resist, the thickness of conductive material in at least one of the two zones Z1, Z2 can be quickly increased by adding a further deposition of material, this time by electrolysis. The conductive grid pattern then serves as an electrode on which the additional conductive material will be reduced and deposited by electrolysis. Such an additional deposition of conductive material can occur in thicknesses that differ between the two zones Z1 and Z2, by varying the electrolysis times between these two zones. FIG. 2b illustrates an embodiment in which the grid pitch and the width of the wires are larger in zone Z2 than in zone Z1.

Other embodiments of the invention may also be obtained by adopting a composition based on a stack of thin layers in one of the two zones Z1 and Z2, and a composition based on a grid of conductive material in the other zone, for the two-dimensional structure 11.

In all cases, and according to an important advantage provided by the invention, the two portions of conductive two-dimensional structure 11 which are formed on face S1 of the substrate 2, respectively in zone Z1 and zone Z2, may be produced with an electrical conduction path 13 which connects one to the other. Depending on the compositions adopted for the conductive two-dimensional structure 11 in the two zones Z1 and Z2, this electrical conduction path may be a continuation of the two-dimensional structure 11 between the two zones Z1 or Z2, or an overlap of the two portions of the two-dimensional structure 11 which are respectively dedicated to zones Z1 and Z2, this overlap producing an electrical connection and being formed in a strip of face S1 which is between the two zones Z1 and Z2. Alternatively, the electrical conduction path 13 may also be composed of an additional conductive layer which is electrically in contact with the two portions of the two-dimensional structure 11 which are separately contained in the zones Z1 and Z2. However, embodiments are preferred in which the electrical conduction path 13 is formed at the same time as at least one of the two portions of the two-dimensional structure 11. Thus, the window 1 is directly provided with a continuous electrical conduction path for the two-dimensional structure 11 between the two zones Z1 and Z2, before being assembled with the housing 30. This leaves only one electrical connection to be established in order to electrically connect the two-dimensional structure 11 to the housing 30 or to ground.

Figure 2C:
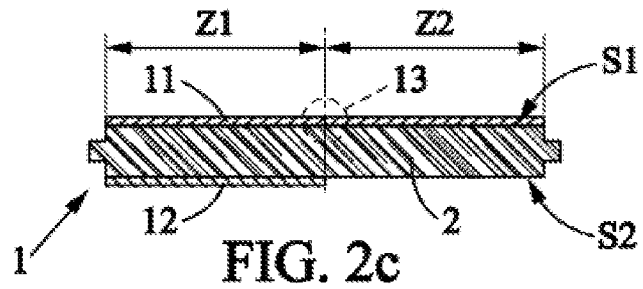

FIG. 2c illustrates yet another embodiment of the invention, wherein the window 1 also includes the two-dimensional structure 11 of face S1 of the substrate 2, but further includes an additional conductive two-dimensional structure 12 in one of two zones Z1, Z2, for example zone Z1, on face S2. The conductive two-dimensional structure 12 may have one of the compositions already described: a stack of thin layers or a grid. It allows selectively increasing the shielding efficiency in zone Z1, in comparison to the shielding provided by dimensional structure 11 only.

Figure 2D:
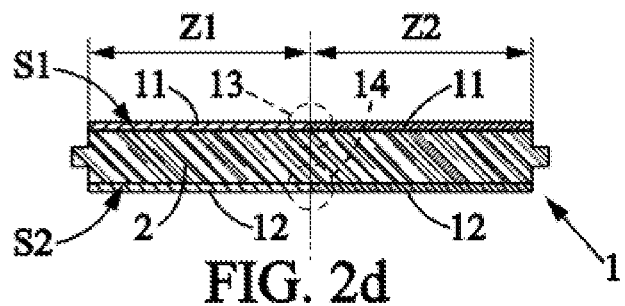

FIG. 2d illustrates yet another embodiment of the invention, wherein the two-dimensional conductive structures 11 and 12 each extend within the two zones Z1 and Z2, respectively on face S1 and on face S2 of the substrate 2. Any combination of the conductive two-dimensional structure compositions already described can be used independently to form the two-dimensional structures 11 and 12 in the two zones Z1 and Z2. It is thus easier to create the window 1 with specified values, for the optical transmission and the shielding efficiency, of which at least one differs between the two zones Z1 and Z2. In one advantageous embodiment of the invention, according to FIG. 2d, the two-dimensional structure 12 also comprises an electrically conductive continuous path 14 which connects the two parts of the conductive two-dimensional structure 12, one to the other, between the two zones Z1 and Z2. The electrical conduction path 14 may have a composition similar to one of those described above for the electrical conduction path 13 of the two-dimensional structure 11.

In general, increasing the total thickness of the conductive material carried by the assembly of the two faces S1 and S2 of the substrate 2 in one of the two zones Z1, Z2, increases the value which is obtained in this zone for the shielding efficiency.

Figure 3:
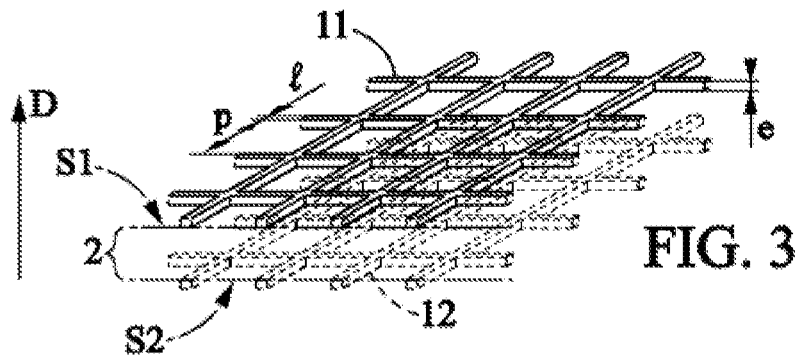
FIG. 3 illustrates an improvement applicable to shielding elements according to FIGS. 2c to 2e.

FIG. 3 illustrates a possible improvement when the two-dimensional structures 11 and 12 have grid compositions in a same one of the two zones Z1, Z2. Preferably, the two respective grids of structures 11 and 12 are aligned relative to one another along a direction D which is perpendicular to the two faces S1 and S2, these being parallel to each other. Such an improvement reduces the total decrease in optical transmission which is caused by the two grid structures. Indeed, each grid is generally optically opaque, and the total shadowing which is caused by the two grids is then substantially equal to the shadowing by only one of them, the pitch of the second grid being equal to an integer multiple of the pitch of the first grid. In FIG. 3, the notations p, I, and e respectively denote the pitch, the wire width, and the wire thickness for one of the two grids.

Another advantage of having two-dimensional structures on both faces S1 and S2 of the substrate 2 in a same one of the two zones Z1 and Z2 (FIGS. 2c to 2e) is the possibility of obtaining a shielding efficiency value at a first frequency value within the range 0.1 GHz-40 GHz, which is greater than the shielding efficiency value at a second frequency value also within the range 0.1 GHz-40 GHz, while the first frequency value is greater than the second frequency value. The difference between the two shielding efficiency values may be greater than 5 dB (decibel), or even greater than 10 dB. This ordering relation between the two shielding efficiency values is enabled by a wave interference effect that occurs between the two two-dimensional structures 11 and 12, when the thickness of the substrate 2 between them is adapted to the frequency of the electromagnetic radiation concerned. Indeed, the two two-dimensional structures 11 and 12 facing the two faces S1 and S2 of the substrate 2 constitute, for the electromagnetic radiation, a Fabry-Perot device which is well known to those skilled in the art.

Figure 2E:
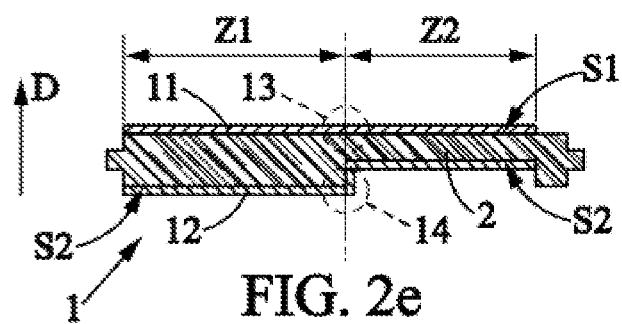
Figure 4:
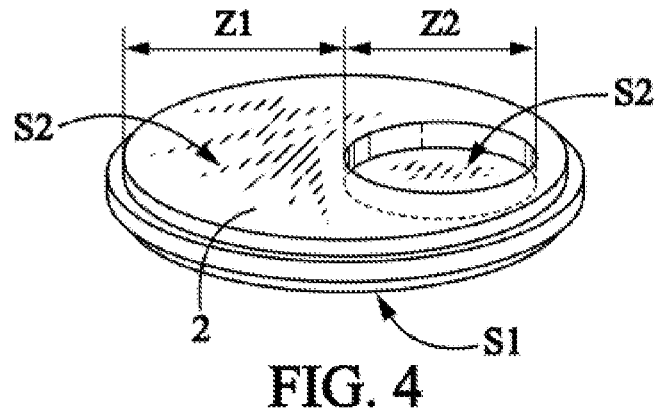
FIG. 4 is a perspective view of a substrate suitable for particular embodiments of a shielding element, again according to the invention.

FIGS. 2e and 4 illustrate particular embodiments of the invention, wherein the thickness of the substrate 2 is different between the two zones Z1 and Z2. Such a variation in thickness can be useful when the two conductive two-dimensional structures 11 and 12 cover the two faces S1 and S2, respectively, each in the two zones Z1 and Z2, in order to produce the wave interference effect just explained. Thus, in these two figures, the thickness of the substrate 2, measured parallel to direction D, is greater in zone Z1 than in zone Z2. For example, the substrate 2 can be produced by directly molding a thermosetting material of the final thicknesses in the two zones Z1 and Z2. Alternatively, the substrate 2 may be initially produced with the same thickness in both zones Z1 and Z2, then thinned by machining and/or polishing in zone Z2. Possibly, and in particular when it is made of sapphire ($Al_2O_3$), the substrate 2 may be produced with a thickness in zone Z2 that is less than that in zone Z1, and the two layers are then adjusted by machining, grinding, and/or polishing to achieve the final thickness values. Preferably, the method for creating the electrical conduction path 14 is compatible with the presence of a step in face S2 between the two zones Z1 and Z2. To achieve this, material deposition methods which are non-directional, such as evaporation, plasma-enhanced chemical vapor deposition, or electrolysis, may be preferred.

The following Tables 1 to 4 group values that were obtained for the optical transmission and shielding efficiency for four examples of windows according to the invention. The substrates used are of glass ($1^{st}$ to $3^{rd}$ examples) or sapphire ($4^{th}$ example); the optical transmission, denoted $T_{opt}$, is given for the two wavelength values of 1 μm and 10 μm, and the shielding efficiency $EB(f) = -10 \cdot \log_{10}(T(f))$ is given for the two frequencies f of 1 GHz and 20 GHz.

TABLE 1

| $1^{st}$ example | Zone Z1 | Zone Z2 |
| --- | --- | --- |
| Substrate thickness (glass B) | 2 mm | 2 mm |
| Composition of two-dimensional structure 11 | Grid (Ag) p = 300 □m l = 20 □m e = 400 nm | Grid (Ag) p = 300 □m l = 20 □m e = 80 nm |
| | No two-dimensional structure 12 | |

TABLE 1-continued

| $1^{st}$ example | Zone Z1 | Zone Z2 |
| --- | --- | --- |
| $T_{opt}$(0.5 μm) in % | 79 | 79 |
| $T_{opt}$(2.5 μm) in % | 76 | 76 |
| EB(2 GHz) in dB | 40 | 35 |
| EB(20 GHz) in dB | 16 | 16 |

TABLE 2

| $2^{nd}$ example | Zone Z1 | Zone Z2 |
| --- | --- | --- |
| Substrate thickness (glass B) | 0.7 mm | 0.7 mm |
| Composition of two-dimensional structure 11 | Homogeneous layer (Ag) e = 10 nm | Homogeneous layer (Ag) e = 10 nm |
| Composition of two-dimensional structure 12 | No two-dimensional structure 12 | Homogeneous layer (Ag) e = 10 nm |
| $T_{opt}$(0.400 μm) in % | 73 | 63 |
| $T_{opt}$(0.535 μm) in % | 65 | 52 |
| EB(2 GHz) in dB | 31 | 35 |
| EB(18 GHz) in dB | 29 | 50 |

TABLE 3

| $3^{rd}$ example | Zone Z1 | Zone Z2 |
| --- | --- | --- |
| Substrate thickness (glass B) | 4 mm | 6 mm |
| Composition of two-dimensional structure 11 | Grid (Ag) p = 550 □m l = 24 □m e = 100 nm | Grid (Ag) p = 550 □m l = 24 □m e = 100 nm |
| Composition of two-dimensional structure 12 | Grid (Ag) p = 550 □m l = 24 □m e = 100 nm | Grid (Ag) p = 550 □m l = 24 □m e = 100 nm |
| $T_{opt}$(0.4 μm) in % | 77% | 77% |
| $T_{opt}$(1 μm) in % | 77% | 77% |
| EB(9 GHz) in dB | 37 | 17 |
| EB(14 GHz) in dB | 18 | 33 |

TABLE 4

| $4^{th}$ example | Zone Z1 | Zone Z2 |
| --- | --- | --- |
| Substrate thickness (sapphire) | 4 mm | 4 mm |
| Composition of two-dimensional structure 11 | Homogeneous layer (ITO) e = 200 nm | Homogeneous layer (ITO) e = 100 nm |
| Composition of two-dimensional structure 12 | No two-dimensional structure 12 | Homogeneous layer (ITO) e = 100 nm |
| $T_{opt}$(1 μm) in % | 85 | 71 |
| $T_{opt}$(2 μm) in % | 60 | 10 |
| EB(2 GHz) in dB | 18 | 19 |
| EB(9 GHz) in dB | 13 | 20 |
| EB(14 GHz) in dB | 18 | 22 |

It is understood that the invention can be reproduced while modifying some minor aspects of the embodiments described in detail above. In particular, the deposition processes used to form the conductive two-dimensional structures and the numerical values which have been mentioned have been for illustrative purposes only, and can be adapted to each application of the invention.

A shaped substrate 2 may also be used and adapted according to each application of the invention.

A grid forming a two-dimensional structure may also have a pattern that is rectangular, hexagonal, triangular, circular, trapezoidal, etc., while satisfying the required performance in terms of shielding efficiency and optical transparency.

An aperiodic mesh, for example Voronoi, may also be used in order to eliminate the Moiré phenomenon related to the superposition of periodic networks, while maintaining similar performance in shielding efficiency and optical transparency.

The embodiments above are intended to be illustrative and not limiting. Additional embodiments may be within the claims. Although the present invention has been described with reference to particular embodiments, workers skilled in the art will recognize that changes may be made in form and detail without departing from the spirit and scope of the invention.

Various modifications to the invention may be apparent to one of skill in the art upon reading this disclosure. For example, persons of ordinary skill in the relevant art will recognize that the various features described for the different embodiments of the invention can be suitably combined, un-combined, and re-combined with other features, alone, or in different combinations, within the spirit of the invention. Likewise, the various features described above should all be regarded as example embodiments, rather than limitations to the scope or spirit of the invention. Therefore, the above is not contemplated to limit the scope of the present invention.

The invention claimed is:

1. An optically transparent electromagnetically shielding element having multiple zones, comprising:
    a rigid substrate having two opposite faces, said rigid substrate at least partially transparent between said two faces to at least one electromagnetic radiation having a frequency f between 0.1 GHz and 40 GHz; and
    at least one electrically conductive two-dimensional structure which is arranged on one of the faces of the substrate, at least within multiple separate zones of the shielding element, and which is at least partially transparent in each of said zones to optical radiation having a wavelength between 0.2 µm and 15 µm;
the rigid substrate also being at least partially transparent between the two faces to each optical radiation, and the substrate being of continuous material between all zones of the shielding element,
the electrically conductive two-dimensional structure having at least one continuous electrical conduction path that connects portions of said two-dimensional structure each contained in one of the zones of the shielding element, for all of said zones,
wherein shielding element has, in a first of the zones, a first set of values formed by a value for an optical transmission and a value for a shielding efficiency, which is different from a second set of values for said optical transmission and said shielding efficiency, effective in a second of the zones, the values for the optical transmission relating to one same wavelength of optical radiation, and the values for the shielding efficiency relating to one same frequency of electromagnetic radiation, for said first and second zones,
the optical transmission relating to the optical radiation which is intended to pass through said shielding element in each zone between the two faces; and
the shielding efficiency, denoted by EB(f) and expressed in decibels, being defined by $EB(f) = -10 \cdot \log_{10}(T(f))$, where $T(f)$ is an energy transmission coefficient of the shielding element for electromagnetic radiation having the frequency f between 0.1 GHz and 40 GHz, and which passes through said shielding element between the two faces in each zone.

2. The shielding element of claim 1, wherein the substrate bears a first electrically conductive two-dimensional structure on a first of the faces in at least two separate zones of the shielding element, and the other face of the substrate bears a second electrically conductive two-dimensional structure in at least one of the two zones, referred to as a double two-dimensional structure zone.

3. The shielding element of claim 2, wherein the substrate is at least partially transparent to at least two electromagnetic radiations having different respective frequencies between 0.1 GHz and 40 GHz,
    and wherein a thickness of the substrate in the double two-dimensional structure zone is such that the value of the electromagnetic shielding efficiency relating to the one of the two electromagnetic radiations having the highest frequency is greater, by at least 5 dB than the value of the electromagnetic shielding efficiency relating to the other of the two electromagnetic radiations having the lowest frequency, when the two electromagnetic radiations pass through the shielding element between the two faces in double two-dimensional structure zone.

4. The shielding element of claim 2, wherein said other face of the substrate bears the second electrically conductive two-dimensional structure also in the two separate zones of the shielding element, and the shielding element has values for a thickness of the substrate measured between the two faces which are different in the two separate zones of the shielding element.

5. The shielding element of claim 2,
    wherein the first and the second electrically conductive two-dimensional structures each comprise a grid of conductive material formed on the corresponding face of the substrate in at least a same one of the two zones of the shielding element, referred to as a double-grid zone, the two faces of the substrate being parallel in the double-grid zone, and one of the two grids being in alignment with at least a portion of the other grid in the double-grid zone, along a direction which is perpendicular to the two faces.

6. The shielding element of claim 1 wherein said at least one electrically conductive two-dimensional structure comprises a layer of a metal or of a transparent conductive oxide.

7. The shielding element of claim 1, wherein said at least one electrically conductive two-dimensional structure comprises a grid of conductive material formed on the face of the substrate.

8. The shielding element of claim 7, wherein said grid has at least one value for a parameter selected among a grid pitch, a grid wire width, and a thickness of the conductive material forming the grid, which is different between two of the zones of the shielding element, the grid pitch and wire width being measured parallel to the face of the substrate, and the metal thickness being measured perpendicularly to the face of the substrate.

9. A detection system comprising at least two optical sensors and a shielding element according to claim 1, wherein the sensors are fixed relative to the shielding element such that a first of the zones of said shielding element remains located between an optical radiation input into a first of the sensors and an optical input field of said first sensor, and a second of the zones of said shielding element remains located between an optical radiation input into a second of the sensors and an optical input field of said second sensor.

* * * * *